(12) United States Patent
Sharma

(10) Patent No.: US 9,640,494 B1
(45) Date of Patent: May 2, 2017

(54) GROUNDED DIE SEAL INTEGRATED CIRCUIT STRUCTURE FOR RF CIRCUITS

(71) Applicant: Peregrine Semiconductor Corporation, San Diego, CA (US)

(72) Inventor: Vikas Sharma, Reading (GB)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/135,190

(22) Filed: Apr. 21, 2016

(51) Int. Cl.
*H01L 23/52* (2006.01)
*H01L 23/66* (2006.01)
*H01L 23/58* (2006.01)
*H01L 23/62* (2006.01)
*H01L 27/12* (2006.01)
*H01L 23/528* (2006.01)
*H01L 21/768* (2006.01)
*H01L 21/84* (2006.01)

(52) U.S. Cl.
CPC ........ *H01L 23/66* (2013.01); *H01L 21/76895* (2013.01); *H01L 21/84* (2013.01); *H01L 23/5286* (2013.01); *H01L 23/585* (2013.01); *H01L 23/62* (2013.01); *H01L 27/1203* (2013.01); *H01L 2223/6605* (2013.01)

(58) Field of Classification Search
CPC ................ H01L 23/10; H01L 23/3142; H01L 23/49503; H01L 23/49506
USPC ........................................ 257/203, 207, 209
See application file for complete search history.

(56) References Cited

U.S. PATENT DOCUMENTS

| 7,382,039 B2 | 6/2008 | Hollenbeck et al. |
| 7,615,841 B2 | 11/2009 | Chen et al. |
| 8,395,239 B2 | 3/2013 | Chen et al. |

*Primary Examiner* — Tan N Tran
(74) *Attorney, Agent, or Firm* — Jaquez Land Greenhaus LLP; Martin J. Jaquez, Esq.; John Land, Esq.

(57) ABSTRACT

An integrated circuit (IC) structure for radio frequency circuits having a grounded die seal that mitigates the effects of parasitic coupling through the die seal. Embodiments include conductive grounding ties that each electrically couple one or more of the internal grounding pads on an IC die within the magnetic loop formed by the die seal ring to an adjacent extent of an IC die seal. Induced parasitic energy within the die seal ring is quickly coupled to ground through the corresponding grounding ties and grounding pads. Accordingly, very little, if any, induced parasitic energy is propagated around the die seal ring.

18 Claims, 5 Drawing Sheets

GROUNDED DIE SEAL INTEGRATED CIRCUIT STRUCTURE FOR RF CIRCUITS

BACKGROUND (1) Technical Field

This invention relates to integrated circuit die seal structures for electronic circuits, and particularly to integrated circuit die seal structures for RF circuits.

(2) Background

As is known in the field of integrated circuit (IC) fabrication, a semiconductor die (also known as a "chip") may include a die seal. A die seal is generally an electrically conductive ring integrally formed as part of a die at or near an outer edge region of a circuit-bearing planar surface of the die designed to protect the integrated circuit from contaminants that may affect the die yield during processing and affect performance of a chip after the chip has been fabricated, and to make the die less susceptible to mechanical stress caused by a die saw. Some IC implementation technologies, such as CMOS, are especially prone to contamination, and thus generally include a die seal. In CMOS-based RF circuits, it is common to make the die seal floating (i.e., having no electrical connection).

FIG. 1 is a top view of one example of a prior art stylized integrated circuit die 100 having a peripheral die seal 102. The illustrated example includes a two-port radio frequency (RF) single-pole, double-throw (SPDT) switch as an illustrative circuit. A common port CP may be selectively coupled to either port P1 or to port P2 by closing a corresponding switch SW1 or SW2, which are typically implemented as field effect transistors (FETs) controlled by other circuitry (not shown); for simplicity, the switches SWn are shown schematically rather than as physical structures on the IC die 100. As is known, a FET switch behaves as a low impedance resistor when closed, and as a capacitor when open.

The ports CP, P1, P2 are typically electrically conductive connection regions or pads placed adjacent an edge of the IC die 100 to facilitate connection to electrically conductive bonding pads (which may be on the other side of the IC die 100, connected by vias) for further connection to external circuitry, such as by wire bonding or flip-chip solder bumps. In order to improve isolation of the various circuit components (e.g., the switches SWn and ports) from each other, the components are typically spaced from each other around the periphery of the die 100, but within the die seal 102. In addition, it is common to place ground pads G along the edges of the IC die 100 to facilitate coupling internal circuit elements through corresponding electrically conductive bonding pads to an external circuit ground.

One application for the illustrated IC die 100 is in a radio system. For example, the common port CP may be connected to an antenna, an RF transmitter circuit may be connected to port P1, and an RF receiver circuit may be connected to port P2. However, for RF circuits operating at high frequencies (equal to or greater than about 10 GHz), the die seal 102 can couple the fundamental energy emanating from activated internal circuitry and re-route such energy to unwanted signal paths, which can subsequently degrade key performance parameters (e.g., isolation, insertion loss, receiver sensitivity, etc.).

FIG. 2 is a top view of the example from FIG. 1 of a prior art stylized integrated circuit die 100 having a peripheral die seal 102, and showing energy flow in an intended signal path and in an unintended signal path. In the illustrated configuration, FET switch SW1 is open (thus behaving as a capacitor, as indicated by the equivalent circuit element representation), decoupling the common port CP from port P1; conversely, FET switch SW2 is closed (thus behaving as a low impedance resistor, as indicated by the equivalent circuit element representation), coupling the common port CP to port P2. If the common port CP is coupled to an external antenna and port P2 is coupled to an RF receiver circuit, RF electromagnetic energy picked up by the antenna would flow along the intended signal path from the common port CP to the receiver port P2, as indicated by the arrow 200. However, that RF electromagnetic energy is inductively coupled to the floating die seal 102 and induces an opposite flow of parasitic energy around the entire die seal 102, as indicated by the arrow 202. The parasitic energy carried by die seal 102 then induces an opposite and unintended flow of parasitic energy in the signal path from the nominally decoupled port P1 to the common port CP, as indicated by the arrow 204. The parasitically coupled energy from the die seal 102 thus generally degrades the isolation between the signal ports P1 and P2.

Accordingly, there is a need for an integrated circuit structure for RF circuits that mitigates the effects of parasitic coupling through a die seal. The present invention meets this need.

SUMMARY OF THE INVENTION

The invention provides an integrated circuit (IC) structure for radio frequency (RF) circuits having a grounded die seal that mitigates the effects of parasitic coupling through the die seal. The grounded die seal structure may be generally used for RF integrated circuits such as switches, mixers, phase shifters, digital step attenuators, digitally tunable capacitor and inductors, etc., but is particularly useful in conjunction with RF circuitry fabricated on high-Q (low loss) substrates, such as silicon-on-insulator (SOI) substrates (which include silicon-on-sapphire substrates), which are particularly prone to parasitic signal coupling at high frequencies (equal to or greater than about 1 GHz, and particularly equal to or greater than about 10 GHz).

Embodiments of the invention include conductive grounding ties that each electrically couple one or more of the internal grounding pads on an IC die to an adjacent extent of the die seal. The location of the ground connection to the die seal is within the magnetic loop formed by the die seal ring. When the IC die is embedded in a grounded system, the die seal will be locally grounded at the extents connected to the grounding tie. Induced parasitic energy within the die seal ring is quickly coupled to ground through the corresponding grounding ties and grounding pads. Accordingly, very little, if any, induced parasitic energy is propagated around the die seal ring.

The details of one or more embodiments of the invention are set forth in the accompanying drawings and the description below. Other features, objects, and advantages of the invention will be apparent from the description and drawings, and from the claims.

DETAILED DESCRIPTION OF THE INVENTION

The invention provides an integrated circuit (IC) structure for radio frequency (RF) circuits having a grounded die seal that mitigates the effects of parasitic coupling through the die seal. The grounded die seal structure may be generally used for RF integrated circuits such as switches, mixers, phase shifters, digital step attenuators, digitally tunable capacitor and inductors, etc., but is particularly useful in conjunction with RF circuitry fabricated on high-Q (low loss) substrates, such as silicon-on-insulator (SOI) substrates (which include silicon-on-sapphire substrates), which are particularly prone to parasitic signal coupling at high frequencies (equal to or greater than about 1 GHz, and particularly equal to or greater than about 10 GHz).

Figure 1:
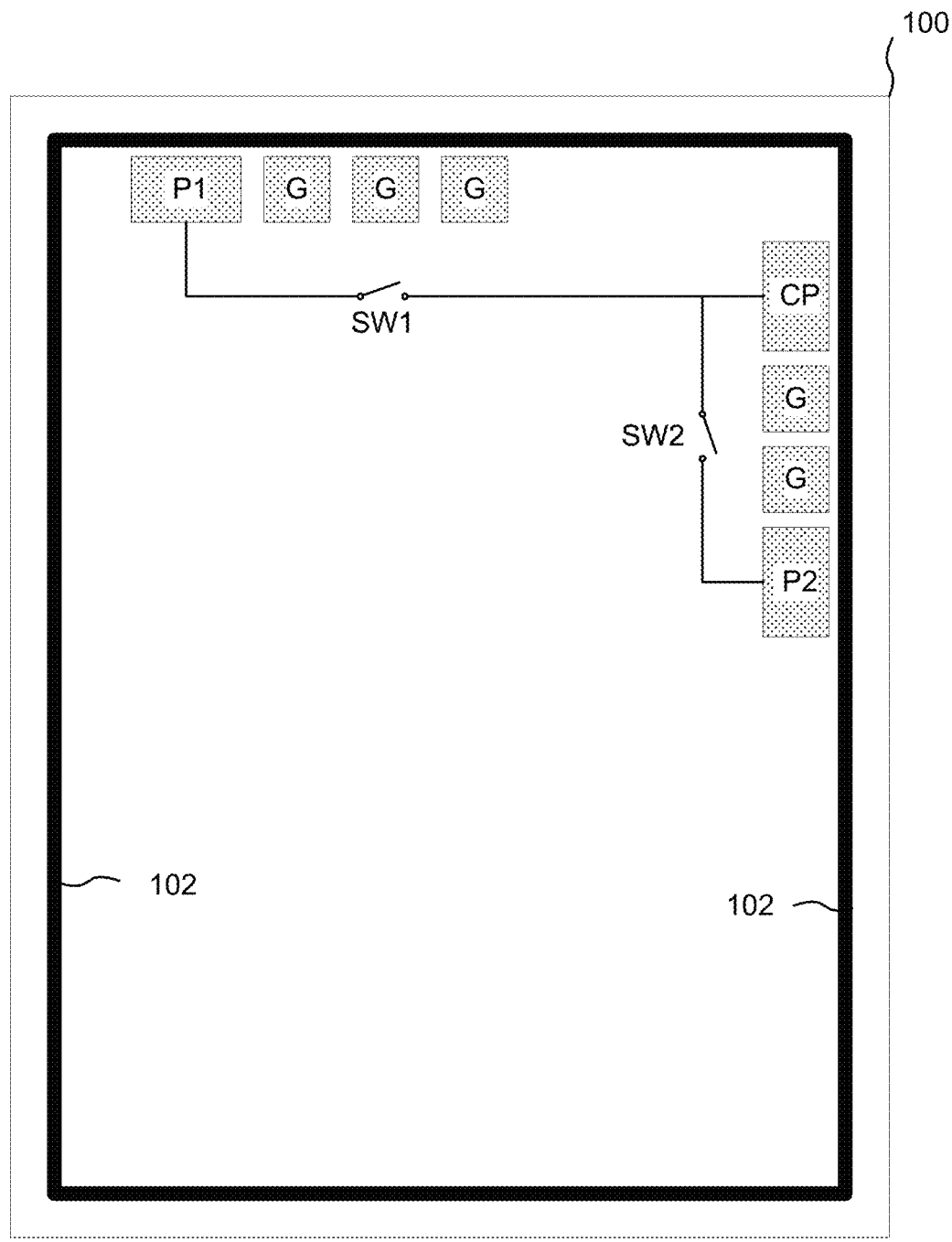
FIG. 1 is a top view of one example of a prior art stylized integrated circuit die having a peripheral die seal.
Figure 3:
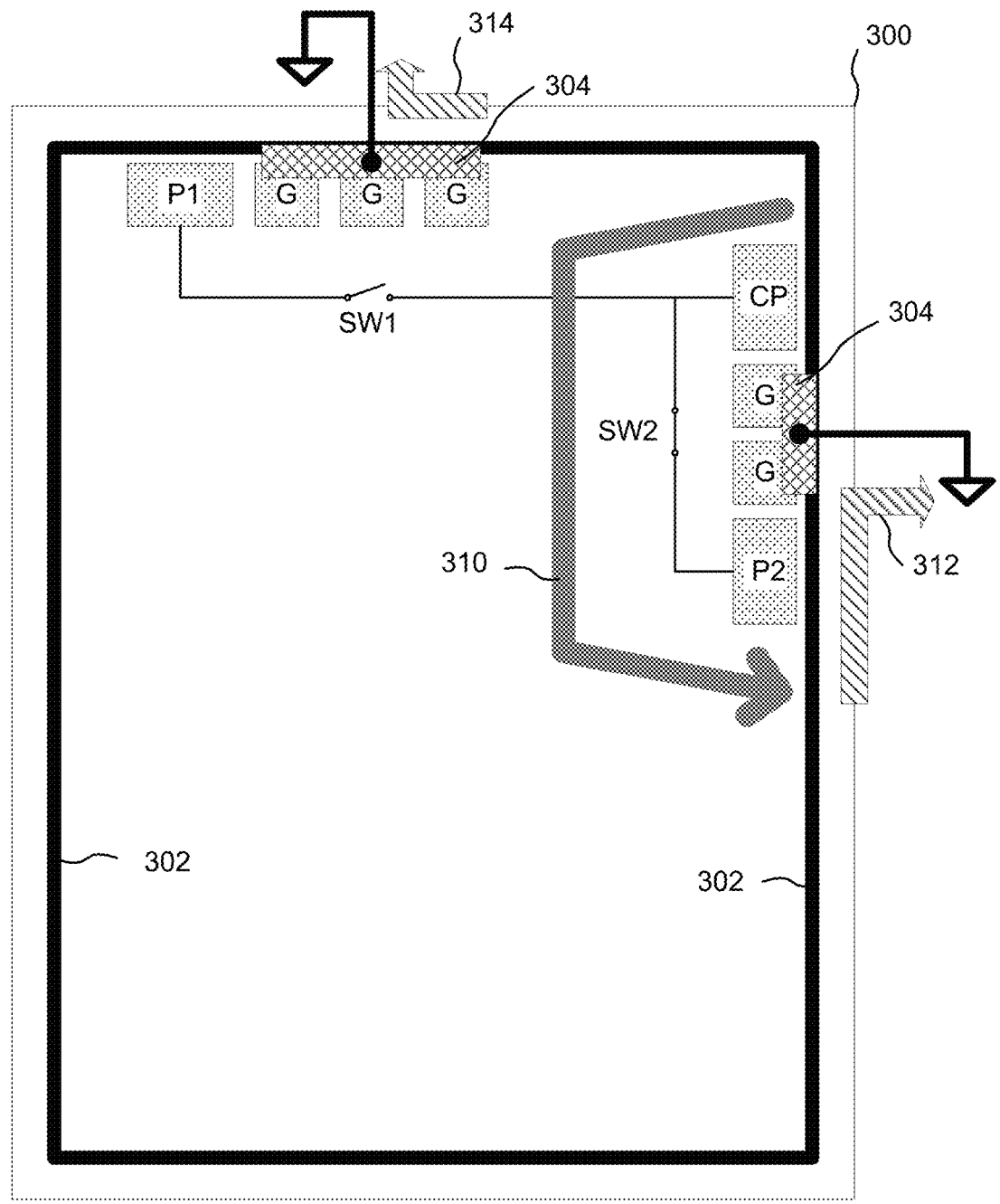
FIG. 3 is a top view of one embodiment of a stylized integrated circuit die having a peripheral grounded die seal in accordance with the present invention.

FIG. 3 is a top view of one embodiment of a stylized integrated circuit die 300 having a peripheral grounded die seal 302 in accordance with the present invention. As in FIG. 1, the illustrated embodiment includes a two-port radio frequency (RF) single-pole, double-throw (SPDT) switch as an illustrative circuit. A common port CP may be selectively coupled to either port P1 or to port P2 by closing a corresponding switch SW1 or SW2, which are typically implemented as field effect transistors (FETs) controlled by other circuitry (not shown); for simplicity, the switches SWn are shown schematically rather than as physical structures on the IC die 300. However, the invention is not limited to FET switches, but encompasses other switch technologies that exhibit electromagnetic coupling characteristics, such as microelectromechanical system (MEMS) switches. The ports CP, P1, P2 are electrically conductive regions or pads placed adjacent an edge of the IC die 300 to facilitate connection to electrically conductive bonding pads (which may be on the other side of the IC die 300, connected by vias) for further connection to external circuitry, such as by wire bonding, flip-chip solder bumps copper pillars, or any other suitable chip interconnect technology. A number of ground pads G are positioned along the edges of the IC die 300 to facilitate coupling internal circuit elements through corresponding electrically conductive bonding pads to an external circuit ground.

Embodiments of the invention include conductive grounding ties 304 that each electrically couple one or more of the internal grounding pads G on the IC die 300 to an adjacent extent of the die seal 302. Notably, the location of the ground connection to the die seal 302 is preferably within the magnetic loop formed by the die seal ring in order to provide the shortest escape route for magnetically coupled energy. When the IC die 300 is embedded in a grounded system (e.g., fully packaged and mounted on a printed circuit board), the die seal 302 will be locally grounded at the extents connected to the grounding ties 304 (in FIG. 3, the connection of the grounding ties 304 to circuit ground is shown symbolically; the actual physical connection to circuit ground is through the grounding pads G within the loop formed by the ring of the die seal 302, which are connected to circuit ground through back-side bonding pads connected by vias, or through solder bumps deposited on the grounding pads G, or through some equivalent connection). "Locally grounded" means that a region or extent surrounding a connection point is essentially at zero potential with respect to DC and/or low frequency signals, but that, due to the impedance of conductors and the behavior of RF signals, extents of the conductor further away from such connection points may not be fully grounded with respect to RF signals.

In the illustrated configuration, switch SW1 is open (thus behaving as a capacitor), decoupling the common port CP from port P1; conversely, switch SW2 is closed (thus behaving as a low impedance resistor), coupling the common port CP to port P2. If the common port CP is coupled to an external antenna and port P2 is coupled to an RF receiver circuit, RF electromagnetic energy picked up by the antenna would flow along the intended signal path from the common port CP to the receiver port P2, as indicated by the arrow 310.

Figure 2:
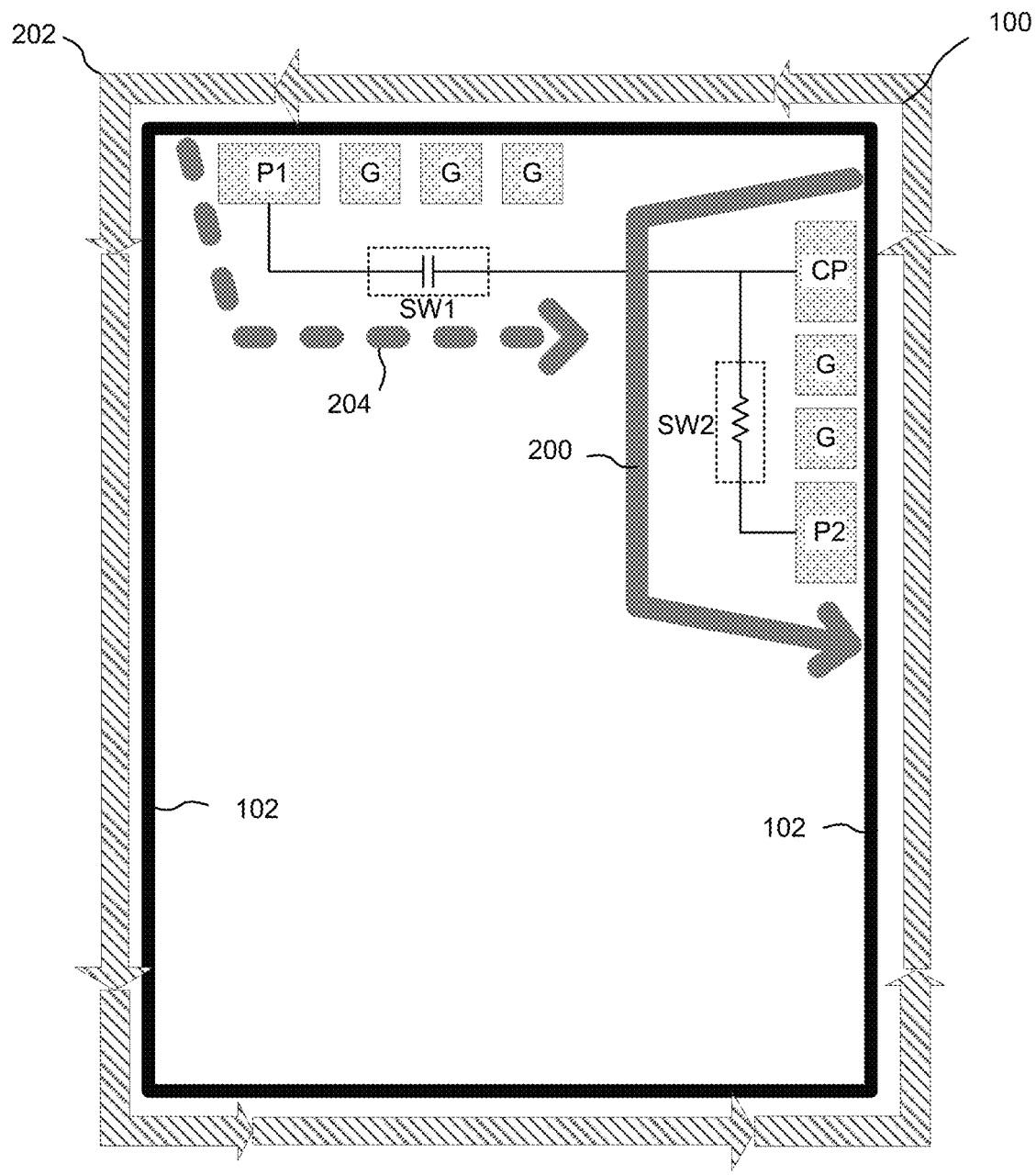
FIG. 2 is a top view of the example from FIG. 1 of a prior art stylized integrated circuit die having a peripheral die seal, and showing energy flow in an intended signal path and in an unintended signal path.

As in the case depicted in FIG. 2, the electromagnetic energy flow represented by the arrow 310 will induce a magnetic field that allows parasitic energy flow in a portion of the die seal 302; the magnitude of the induced parasitic energy flow is frequency dependent and also varies as function of other parameters (e.g., the coupling factor for the IC die 300 substrate, die seal area/perimeter, the distance between the intended signal path and the adjacent die seal 302, etc.). However, unlike the case depicted in FIG. 2, the parasitic energy represented by the arrow 310 is quickly allowed to escape to ground through the corresponding grounding ties 304 and grounding pads G positioned between the common port CP and the receiver port P2, as indicated by the arrow 312 (again, the connection of the grounding ties 304 to circuit ground is shown symbolically; the actual physical connection to circuit ground is through the grounding pads G within the loop formed by the ring of the die seal 302). Accordingly, very little, if any, induced parasitic energy is propagated around the die seal 302 ring.

In addition, the grounding ties 304 coupled to grounding pads G near the open switch SW1 will also direct any locally induced parasitic current to circuit ground, as indicated by the arrow 314.

It may be useful to selectively connect the grounding ties 304 only to grounding pads G located between active circuit pads, such as between the common port CP and port P1 and between the common port CP and port P2, as shown in FIG. 3. Such an arrangement generally can be made to ensure that all induced parasitic energy in the die seal 302 dies out before reaching a sensitive port.

In some applications, it may even be practical to "tune" the placement or selective connection of grounding ties 304 to grounding pads G around the die seal 302 for a specific frequency or range of frequencies to balance induced parasitic currents against true currents to achieve optimum cancellation of propagated parasitic energy at specific locations within the loop of the die seal 302. Thus, while grounding some extents of the die seal 302, other extents of the die seal 302 may be purposely left ungrounded to allow inducement of parasitic currents as a cancellation mechanism for currents generated elsewhere on the die 300, and thus can be used as a way to further improve isolation. An IC layout on a die 300 may be modeled or prototyped to test which grounding pads G should be connected to the die seal 302 through grounding ties 304 to achieve such tuning effects for a particular circuit.

Further, the placement of grounding ties 304 may be optimized for a specific circuit configuration. For example, in the SPDT switch shown in FIG. 3, it may be more important to optimize isolation for the receiver path than for the transmitter path, and accordingly the placement of grounding ties 304 and the number of utilized grounding pads G may favor one signal port over the other. Such optimization may be performed by modeling a proposed circuit and IC layout.

While FIG. 3 shows all of the grounding ties 304 to be a large conductive region (e.g., a selectively patterned metallization layer) overlying one or more grounding pads G, in an alternative embodiment, some or all of the grounding ties 304 may be implemented as bonding wire connections, fusible links, and/or low-impedance switches (e.g., FETs hard-wired ON or switchably enabled to ON using, for example, fusible links), or the like. In the case of bonding wire connections, one or more bonding wires (multiple wires provide lower impedance) may be connected between a selected grounding pad G and an adjacent extent of the die seal 302. In the case of fusible links, each fusible link would be connected between an associated grounding pad G and an adjacent extent of the die seal 302; to enable optimization, some fusible links may be "blown" (to create an open circuit) to disconnect selected grounding pads G from the die seal 302. Which fusible inks to "blow" or which grounding pads G to selectively connect to an adjacent extent of the die seal 302 may be determined by modelling a proposed circuit and IC layout and applying the results to all IC dies 300, or by testing samples of actual IC dies in different connection state configurations and applying the results to all IC dies 300, or by testing and individually setting the connection state configuration for each IC die 300.

A more general rule for grounding tie 304 placement is to tie the die seal 302 to ground connections within the magnetic loop formed by the die seal ring in as many locations as feasible. However, a convenient rule of thumb is that the ground ties 304 for the die seal 302 be spaced around the die seal periphery approximately every distance d, where d equals the RF wavelength $\lambda$ divided by 10 (i.e., $d=\lambda/10$). (Since an RF circuit will handle a band of frequencies, $\lambda$ is generally based on the mid band frequency; however, depending on the application, a particular frequency can be chosen to achieve an application specific optimum). Doing so makes the die seal 302 resemble a continuum ground, providing an overall E field gradient along its periphery that is very low and thus will carry little parasitic energy. However, the ground tie placements may be placed farther apart than distance d, a configuration that is still electrically shorter than having the die seal 302 be completely floating.

Figure 4:
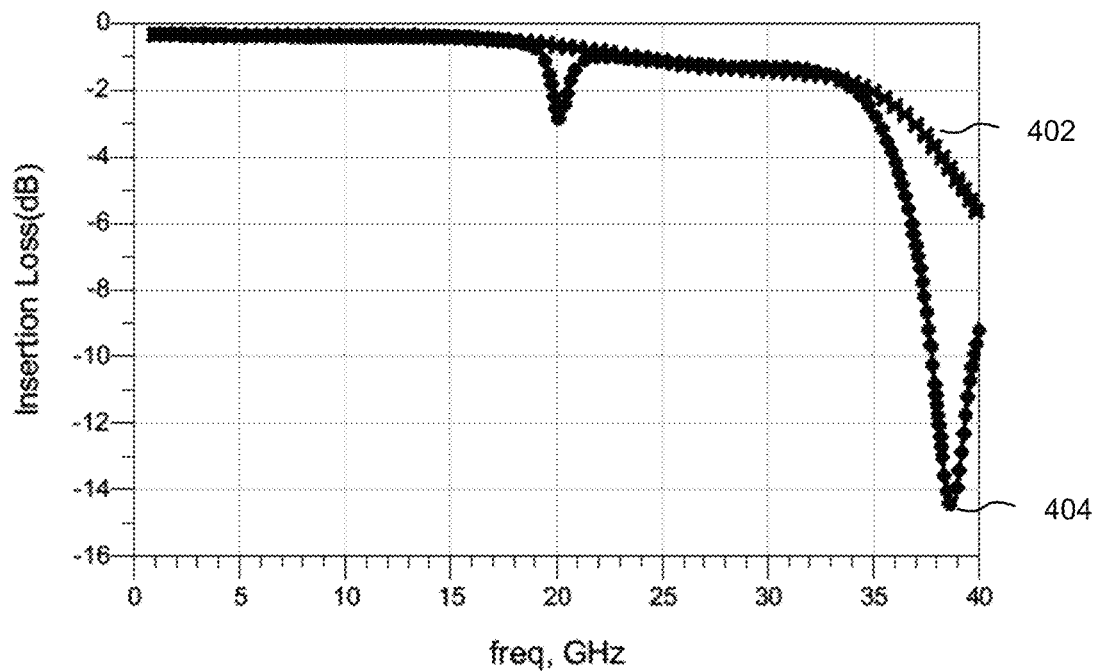
FIG. 4 is a graph of insertion loss (in dB) versus frequency (in GHz) for a modelled SPDT embodiment of the present invention and for a conventional design.
Figure 5:
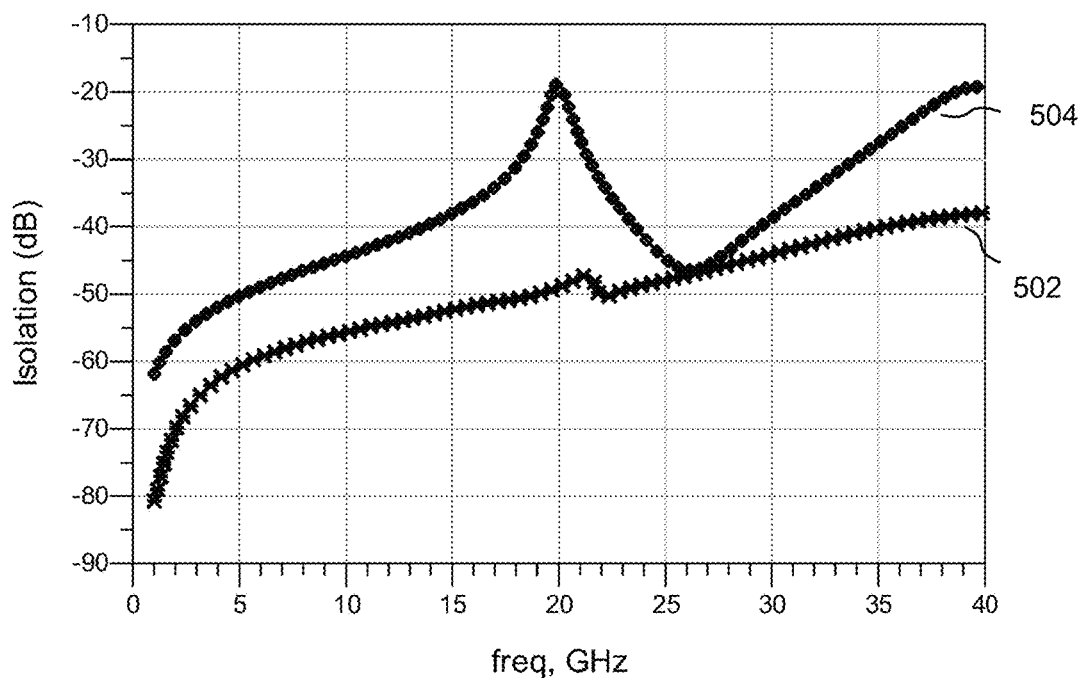
FIG. 5 is a graph of isolation (in dB) versus frequency (in GHz) for a modelled SPDT embodiment of the present invention and for a conventional design Like reference numbers and designations in the various drawings indicate like elements.

The embodiment illustrated in FIG. 3 provides for broadband isolation. Simulations of the SPDT configuration shown in FIG. 3 implemented in CMOS on an SOI substrate have shown an isolation improvement of 10 dB to 20 dB and improved insertion loss over a range of frequencies from about 1 GHz to about 40 GHz compared to a conventional design. For example, FIG. 4 is a graph 400 of insertion loss (in dB) versus frequency (in GHz) for a modelled SPDT embodiment of the present invention and for a conventional design. Curve 402 shows the insertion loss for the SPDT embodiment with a grounded die seal in accordance with the present invention, while curve 404 shows the insertion loss for a conventional SPDT embodiment with a floating die seal. As can be seen, a grounded die seal configuration results in a flatter insertion loss curve over the illustrated frequency range. As another example, FIG. 5 is a graph 500 of isolation (in dB) versus frequency (in GHz) for a modelled SPDT embodiment of the present invention and for a conventional design. Curve 502 shows the isolation for the SPDT embodiment with a grounded die seal in accordance with the present invention, while curve 504 shows the isolation for a conventional SPDT embodiment with a floating die seal. As can be seen, a grounded die seal configuration results in improved (and more uniform) isolation over the illustrated frequency range.

It is important to note that "ground", "circuit ground", or "RF ground" in the context of the invention refers to a ground connection suitable for RF circuitry, rather than to "digital" ground. Conventionally, a digital ground is used for a DC and/or low frequency digital circuit and/or as an electro-static discharge (ESD) return path. Such circuits in general do not carry a significant amount of root-mean square (RMS) current. Since a digital ground is used for DC and/or frequencies and does not carry significant RMS current, only a few digital ground pad connections are generally needed. However, such connections (e.g., via a bond wire or flip chip bumps or pillars) can be electrically large at high RF frequencies (e.g., greater than about 1 GHz, and particularly greater than about 10 GHz). If a die seal is tied to digital ground, the connections can act as an antenna and pick up parasitic energy induced by nearby signal paths. Accordingly, the grounding pads G and the grounding ties 304 should be designed to take into account the grounding requirements of RF circuitry.

It should be appreciated that the inventive concepts are not limited to SPDT RF switches, and are applicable to other RF switch architectures (e.g., SPnT switches) and other RF circuits, including (but not limited to) mixers, phase shifters, digital step attenuators, digitally tunable capacitor and inductors, and any combination of such circuits. Further, it is possible that in a highly integrated circuit containing various RF sub-circuit blocks, one RF sub-circuit block may induce parasitic energy onto the die seal which can cause the performance degradation of another RF sub-circuit block as such energy is carried around the die seal. The current inventive concept can be applied to mitigate or overcome such degradation.

Methods

Another aspect of the invention includes a method for improving isolation of connection pads in an integrated circuit structure for RF circuits, including: providing an integrated circuit die having a die seal defining a ring, a plurality of electrically conductive connection pads disposed within the die seal ring, and at least one ground pad, each disposed adjacent a corresponding extent of the die seal ring and within the die seal ring, and configured to be electrically coupled to a circuit ground; and electrically connecting at least one ground pad to a corresponding extent of the die seal ring adjacent to such at least one ground pad.

Other aspects of the above method include at least one electrical circuit being coupled to at least one electrically conductive connection region; at least one electrical circuit being coupled between at least two electrically conductive connection pads; positioning at least one ground pad between an adjacent pair of the plurality of electrically conductive connection pads; at least one electrical connection being between the at least one ground pad to the corresponding extent of the die seal ring is a fusible link; integrated circuit die being a silicon-on-insulator (SOI) substrate; and configuring the electrical connections between the at least one ground pad to the corresponding extent of the die seal ring to provide at least about 10 dB of isolation improvement between the plurality of electrically conductive connection pads at RF frequencies equal to or greater than about 1 GHz, and particularly equal to or greater than about 10 GHz.

Yet another aspect of the invention includes a method for improving isolation of connection pads in an integrated circuit structure for RF circuits, including: providing an integrated circuit die having a die seal defining a ring, a plurality of electrically conductive connection pads disposed within the die seal ring, at least one ground pad, each disposed adjacent a corresponding extent of the die seal ring and within the die seal ring, and positioned between an adjacent pair of the plurality of electrically conductive connection region, and configured to be electrically coupled to a circuit ground, and at least one electrical circuit coupled between at least two electrically conductive connection pads; electrically connecting at least one ground pad to a corresponding extent of the die seal ring adjacent to such at least one ground pad; and configuring the electrical connections between the at least one ground pad to the corresponding extent of the die seal ring to provide at least about 10 dB of isolation improvement between the plurality of electrically conductive connection pads at RF frequencies equal to or greater than about 10 GHz.

Fabrication Technologies and Options

As should be readily apparent to one of ordinary skill in the art, various embodiments of the invention can be implemented to meet a wide variety of specifications. Additional circuit components may be added to enhance the capabilities of the disclosed circuits and/or to provide additional functional without significantly altering the functionality of the disclosed circuits.

Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly above about 10 GHz). Monolithic IC implementation is particularly useful since parasitic capacitances generally can be kept low (or at a minimum, kept uniform across all units, permitting them to be compensated) by careful design.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A grounded die seal integrated circuit structure for radio frequency (RF) circuits, including:
   (a) an integrated circuit die having:
      (1) a die seal defining a ring,
      (2) a plurality of electrically conductive connection pads disposed within the die seal ring, and
      (3) at least one RF ground pad, each disposed adjacent a corresponding extent of the die seal ring and within the die seal ring, and configured to be electrically coupled to a circuit ground; and
   (b) at least one grounding tie, each electrically connected to a corresponding extent of the die seal ring and to at least one RF ground pad adjacent to such corresponding extent of the die seal ring.

2. The invention of claim 1, wherein the integrated circuit die further includes at least one electrical circuit coupled to at least one electrically conductive connection region.

3. The invention of claim 1, wherein the integrated circuit die further includes at least one electrical circuit coupled between at least two electrically conductive connection pads.

4. The invention of claim 1, wherein at least one RF ground pad is positioned between an adjacent pair of the plurality of electrically conductive connection pads.

5. The invention of claim 1, wherein at least one grounding tie is a fusible link.

6. The invention of claim 1, wherein the integrated circuit die is a silicon-on-insulator (SOI) substrate.

7. The invention of claim 1, wherein the grounding ties are configured to provide at least about 10 dB of isolation improvement between the plurality of electrically conductive connection pads at RF frequencies equal to or greater than about 10 GHz.

8. The invention of claim 1, wherein the grounding ties are spaced around the die seal approximately every distance d, where d equals an RF wavelength $\lambda$ divided by 10.

9. A grounded die seal integrated circuit structure for radio frequency (RF) circuits, including:
   (a) a silicon-on-insulator integrated circuit die having:
      (1) a die seal defining a ring,
      (2) a plurality of electrically conductive connection pads disposed within the die seal ring,
      (3) at least one RF ground pad, each disposed adjacent a corresponding extent of the die seal ring and within the die seal ring, and positioned between an adjacent pair of the plurality of electrically conductive connection region, and configured to be electrically coupled to a circuit ground, and
      (4) at least one electrical circuit coupled between at least two electrically conductive connection pads; and
   (b) at least one grounding tie, each electrically connected to a corresponding extent of the die seal ring and to at least one RF ground pad adjacent to such corresponding extent of the die seal ring, wherein the grounding ties are configured to provide at least about 10 dB of isolation improvement between the plurality of electrically conductive connection pads at RF frequencies equal to or greater than about 10 GHz.

10. A method for improving isolation of connection pads in an integrated circuit structure for radio frequency (RF) circuits, including:
   (a) providing an integrated circuit die having:
      (1) a die seal defining a ring,
      (2) a plurality of electrically conductive connection pads disposed within the die seal ring, and (3) at least one RF ground pad, each disposed adjacent a corresponding extent of the die seal ring and within the die seal ring, and configured to be electrically coupled to a circuit ground; and (b) electrically connecting at least one RF ground pad to a corresponding extent of the die seal ring adjacent to such at least one RF ground pad.

11. The method of claim 10, wherein the integrated circuit die further includes at least one electrical circuit coupled to at least one electrically conductive connection region.

12. The method of claim 10, wherein the integrated circuit die further includes at least one electrical circuit coupled between at least two electrically conductive connection pads.

13. The method of claim 10, further including positioning at least one RF ground pad between an adjacent pair of the plurality of electrically conductive connection pads.

14. The method of claim 10, further including selectively making at least one electrical connection between the at least one RF ground pad to the corresponding extent of the die seal ring by means of a fusible link.

15. The method of claim 10, wherein the integrated circuit die is a silicon-on-insulator (SOI) substrate.

16. The method of claim 10, further including configuring the electrical connections between the at least one RF ground pad to the corresponding extent of the die seal ring to provide at least about 10 dB of isolation improvement between the plurality of electrically conductive connection pads at RF frequencies equal to or greater than about 10 GHz.

17. The method of claim 10, further including spacing the electrically connections around the die seal approximately every distance d, where d equals an RF wavelength $\lambda$ divided by 10.

18. A method for improving isolation of connection pads in an integrated circuit structure for radio frequency (RF) circuits, including:

(a) providing an integrated circuit die having:
 (1) a die seal defining a ring,
 (2) a plurality of electrically conductive connection pads disposed within the die seal ring,
 (3) at least one RF ground pad, each disposed adjacent a corresponding extent of the die seal ring and within the die seal ring, and positioned between an adjacent pair of the plurality of electrically conductive connection region, and configured to be electrically coupled to a circuit ground, and
 (4) at least one electrical circuit coupled between at least two electrically conductive connection pads;

(b) electrically connecting at least one RF ground pad to a corresponding extent of the die seal ring adjacent to such at least one RF ground pad; and (c) configuring the electrical connections between the at least one RF ground pad to the corresponding extent of the die seal ring to provide at least about 10 dB of isolation improvement between the plurality of electrically conductive connection pads at RF frequencies equal to or greater than about 10 GHz.

* * * * *